(12) United States Patent
Santore et al.

(10) Patent No.: US 11,552,458 B2
(45) Date of Patent: Jan. 10, 2023

(54) DISTRIBUTION PANEL FOR INTELLIGENTLY CONTROLLED SOLID-STATE CIRCUIT BREAKERS

(71) Applicant: Atom Power, Inc., Huntersville, NC (US)

(72) Inventors: Taylor Santore, Charlotte, NC (US);
Frederick Miller, Charlotte, NC (US);
Denis Kouroussis, Markham (CA);
Ryan Kennedy, Cornelius, NC (US)

(73) Assignee: Atom Power, Inc., Huntersville, NC (US)

( * ) Notice: Subject to any disclaimer, the term of this patent is extended or adjusted under 35 U.S.C. 154(b) by 0 days.

(21) Appl. No.: 17/697,223

(22) Filed: Mar. 17, 2022

(65) Prior Publication Data

US 2022/0209511 A1 Jun. 30, 2022

Related U.S. Application Data

(62) Division of application No. 16/898,569, filed on Jun. 11, 2020, now Pat. No. 11,309,690.

(Continued)

(51) Int. Cl.
| | |
|---|---|
| *H02B 1/04* | (2006.01) |
| *H02H 3/02* | (2006.01) |
| *H02B 1/56* | (2006.01) |
| *H05K 7/20* | (2006.01) |
| *H05K 5/00* | (2006.01) |

(Continued)

(52) U.S. Cl.
CPC ............... *H02B 1/04* (2013.01); *H02B 1/56* (2013.01); *H02H 1/0007* (2013.01); *H02H 3/027* (2013.01); *H02H 3/08* (2013.01); *H03K 17/56* (2013.01); *H05K 5/0017* (2013.01); *H05K 7/2039* (2013.01); *H05K 7/20172* (2013.01)

(58) Field of Classification Search
None
See application file for complete search history.

(56) References Cited

U.S. PATENT DOCUMENTS

| | | | | |
|---|---|---|---|---|
| 7,816,815 | B2 * | 10/2010 | Siciliano | ............... G01R 29/16 307/126 |
| 2004/0113804 | A1 * | 6/2004 | Cabrera | ............... H05K 7/1487 361/627 |

(Continued)

*Primary Examiner* — Courtney L Smith
(74) *Attorney, Agent, or Firm* — Patent Law Professionals, P.C.; William E. Winters

(57) ABSTRACT

An electrical distribution panel for controlling the distribution of electrical power to a plurality of loads includes a plurality of solid-state circuit breakers (SSCBs), each including a thermally conductive heatspreader and one or more power semiconductor devices that control whether electrical current is able to flow to an attached load; a distribution panel heatsink configured in thermal contact with the SSCB heatspreaders; one or more cooling fans that blow air onto the distribution panel heatsink; a stacked bus bar with quick-fit pin-mount receptacles for receiving mating/matching press-fit connection pins located on line-side terminals of the SSCBs; a communications and control (comm/control) bus communicatively coupled to the plurality of SSCBs; and a head-end interface and gateway to which an external computer can connect, to, among other things, set and alter trip settings of the plurality of SSCBs via the comm/control bus.

16 Claims, 14 Drawing Sheets

Related U.S. Application Data

(60) Provisional application No. 62/860,913, filed on Jun. 13, 2019, provisional application No. 62/860,916, filed on Jun. 13, 2019.

(51) Int. Cl.
*H02H 1/00* (2006.01)
*H02H 3/08* (2006.01)
*H03K 17/56* (2006.01)
*H02H 3/027* (2006.01)

(56) References Cited

U.S. PATENT DOCUMENTS

| | | | | |
|---|---|---|---|---|
| 2009/0206059 | A1* | 8/2009 | Kiko | H02J 13/00017 |
| | | | | 218/143 |
| 2010/0118458 | A1* | 5/2010 | Coffey | H02H 7/22 |
| | | | | 361/65 |
| 2011/0149483 | A1* | 6/2011 | Diaz | H02B 1/056 |
| | | | | 361/637 |
| 2016/0294179 | A1* | 10/2016 | Kennedy | H02H 7/261 |
| 2016/0322802 | A1* | 11/2016 | Coffey | H02J 1/108 |
| 2017/0063051 | A1* | 3/2017 | Sharp | H02B 1/14 |
| 2017/0256934 | A1* | 9/2017 | Kennedy | H02H 3/20 |
| 2019/0341213 | A1* | 11/2019 | Kouroussis | H02H 3/167 |

* cited by examiner

DISTRIBUTION PANEL FOR INTELLIGENTLY CONTROLLED SOLID-STATE CIRCUIT BREAKERS

CROSS-REFERENCE TO RELATED APPLICATIONS

This application is a divisional of U.S. patent application Ser. No. 16/898,569, filed Jun. 11, 2020, and claims the benefit of U.S. Provisional Patent Application No. 62/860,916, filed Jun. 13, 2019, and U.S. Provisional Patent Application No. 62/860,913, filed Jun. 13, 2019.

BACKGROUND OF THE INVENTION

Distribution panels (also known as: "distribution boards," "panelboards," "breaker panels," and "electrical panels") employ circuit breakers to control the delivery and distribution of electrical power to loads (e.g., lights, appliances, HVAC systems, etc.) in residences and commercial buildings. Conventional circuit breakers are electromechanical in nature, typically including an electromagnet that operates to separate the breaker's contacts as quickly as possible when a short circuit occurs, and a thermally responsive bimetallic strip that separates the circuit breaker's contacts after an overload has persisted in the circuit for an unacceptably long duration time.

Although conventional circuit breakers have been in widespread use for many years, one significant drawback they have is that they are slow to respond to and isolate faults—typically requiring several milliseconds to respond. The slow reaction time is undesirable since it increases the risk of fire in electrical wiring and damage to electrical equipment, and arc flashes, which can melt and weld the breaker's contacts back together and, in some circumstances, even cause the breaker to explode. Conventional circuit breakers are also not easily controlled from a remote location, for example, over a computer network or the Internet. In other words, they are not well suited for so-called 'smart' power distribution.

These and other problems have led some forward-thinking electrical power engineers to contemplate the possibility of replacing slow and 'dumb' conventional circuit breakers with fast, intelligent, and digitally controlled circuit breakers that exploit the unique capabilities of solid-state devices. Solid-state devices are attractive since they are capable of interrupting current flow in a matter of microseconds, compared to the several milliseconds it normally takes for a conventional circuit breaker to trip. The fast reaction times lower the risk of fire and damage to electrical equipment and, if properly controlled, solid-state devices can reduce the possibility of arc flashes occurring. Moreover, solid-state devices are naturally suited for digital control and the smart distribution of power.

With a lot of effort and creativity, smart solid-state circuit breakers and the smart distribution of power are becoming a reality. See for example, "*How the World's First Digital Circuit Breaker Could Comnpletely Change Our Powered World*," Popular Mechanics, May 22, 2019, which is an article highlighting the first-ever UL-certified digital circuit breaker, recently issued U.S. Pat. No. 10,541,530, entitled "Hybrid Air-Gap/Solid-State Circuit Breaker;" and recently issued U.S. Pat. No. 10,276,321, entitled "Dynamic Coordination of Protection Devices in Electrical Distribution Systems," both assigned to Atom Power, Inc. of Charlotte, N.C. Although the early success is promising, various problems and hurdles are encountered when attempting to incorporate these new types of 'smart' or 'intelligently controlled' circuit breakers into distribution panels. New innovations needed to address these problems are the subjects of the present application.

BRIEF SUMMARY OF THE INVENTION

An electrical distribution panel for controlling the distribution of electrical power to a plurality of loads is disclosed. In one exemplary embodiment of the invention, the electrical distribution panel includes: a plurality of solid-state circuit breakers (SSCBs), each including a thermally conductive heatspreader and one or more power semiconductor devices that control whether electrical current is able to flow to an attached load; a distribution panel heatsink configured in thermal contact with the SSCB heatspreaders; one or more cooling fans that blow air onto the distribution panel heatsink; a multilayered (i.e., 'stacked') bus bar; a communications and control (comm/control) bus communicatively coupled to the plurality of SSCBs; and a head-end interface and gateway to which an external computer can connect, to, among other things, set and alter trip settings of the plurality of SSCBs via the comm/control bus.

According to one embodiment of the invention, each of the SSCBs includes a closeable air gap connected in series with the SSCB's solid-state device, between the SSCB's line-side and load-side terminals, and an air gap assembly that controls whether the SSCB's air gap is open or closed. Upon the SSCB detecting a short circuit or overload of unacceptably long duration, the air gap assembly triggers the air gap to open, thereby providing galvanic isolation between the SSCB's line-side and load-side terminals and electrically isolating the SSCB's attached load and load circuit. In a related embodiment, each of the SSCBs operates, at any given time, in one of three operating states: an ON state, a STANDBY state, or an OFF state, and each SSCB includes indicators and/or buttons that indicate, at any given time, whether the SSCB is in the ON state, the STANDBY state, or OFF state.

In one embodiment of the invention, the line-side terminals of each SSCB includes press-fit connection pins that press and fit into mating/matching quick-fit pin-mount receptacles formed in the stacked busbar, thereby facilitating quick, easy, and repeatable installation of the SSCBs to the busbar.

In one embodiment of the electrical distribution panel, each of the SSCBs includes an electronic display configured to display real-time and/or non-real-time information, and in a related embodiment, the information displayed by SSCB electronic displays is set and controlled by an external computer, via the head-end interface and comm/control bus. In a related embodiment, the electrical distribution panel is housed in a panelbox, with a panelbox door and a panelbox window, through which the plurality of SSCBs can be viewed, including their respective electronic displays and whether the SSCBs are in the ON state, STANDBY state, or OFF state. In yet another related embodiment, the electrical distribution panel further includes a panelboard display held by or affixed to the panelbox door. The panelboard display is configured to display real-time and/or non-real-time information relating to the electrical distribution panel such as, for example, an identification of an electrical power source from which the electrical distribution panel is being fed, real-time current and/or voltage information, panel temperature, etc., and is communicatively coupled to the comm/ control bus, so that an external computer coupled to the head-end interface and gateway can set and control what information is displayed.

Further features and advantages of the invention, including a detailed description of the above-summarized and other exemplary embodiments of the invention, will now be described in detail with respect to the accompanying drawings, in which like reference numbers are used to indicate identical or functionally similar elements.

DETAILED DESCRIPTION

Figure 1:
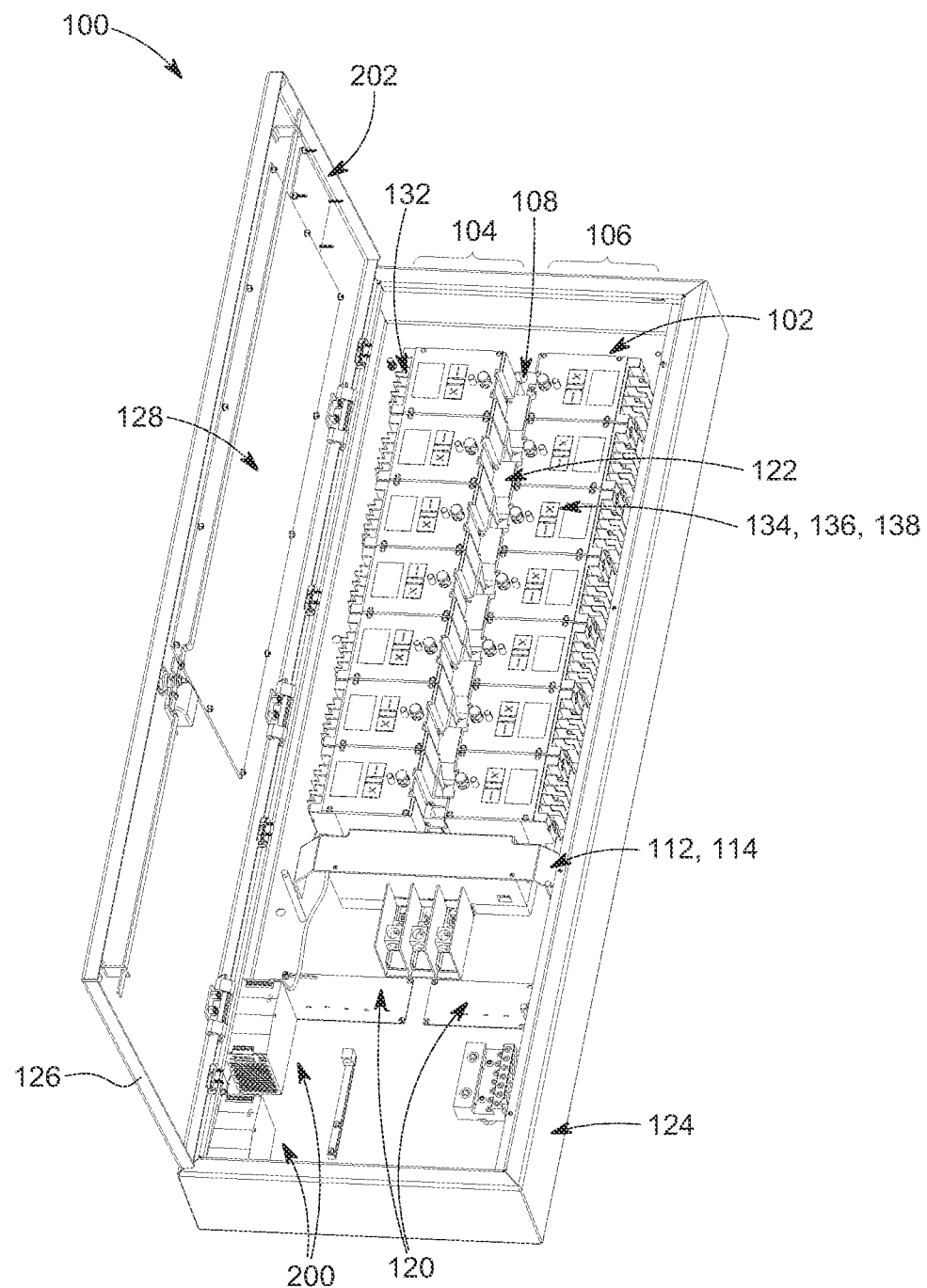
FIG. 1 is a perspective view drawing depicting an electrical distribution panel, according to one embodiment of the present invention.

Referring to FIG. 1 there is shown a front perspective view of an electrical distribution panel 100, according to one embodiment of the present invention. The exemplary electrical distribution panel 100 (or "distribution panel" or simply "panel" for short) comprises a plurality of solid-state circuit breakers (SSCBs) 102 arranged in left and right columns 104 and 106 (seven in each column in this example); stacked busbar 108; communications and control (comm/control) bus 110; head-end interface 112 with gateway control board 114; distribution panel heatsink 150 (visible in other drawings; see, e.g., FIG. 9); one or more cooling fans 118 with front-access fan covers 120; and hot-connection covers 122. Note that not all of these various components of the distribution panel 100 are visible in FIG. 1 but every one of them can be seen in at least one of the other drawings presented in FIGS. 2-14 of this disclosure. It should also be mentioned that the distribution panel 100, which may also be referred to as a "smart distribution panel 100" in various embodiments of the invention set forth in this disclosure, is preferably (though not necessarily) housed within a panelbox 124 that includes a door 126 with a window 128, through which a person (e.g., building owner or electrician) can view the SSCBs 102 and their individual electronic displays 132 and ON/OFF/STANDBY buttons and/or indicators 134, 136, 138.

In the exemplary embodiments of the electrical distribution panel 100 described herein, the SSCBs 102 are similar in construction and operation to the SSCBs described in copending and commonly assigned U.S. patent application Ser. No. 16/898,538, which is incorporated herein by reference. It should be emphasized, however, that the exemplary electrical distribution panel 100 could be adapted so that it serves as a distribution panel for other 'smart' and/or 'intelligently controlled' SSCBs that utilize solid-state devices (specifically, power semiconductors) to control the delivery and distribution of electrical power in an electrical distribution system. For example, the exemplary electrical distribution panel 100 could be adapted to serve as a distribution panel for SSCBs similar to those described in commonly assigned U.S. Pat. No. 10,541,530, entitled "Hybrid Air-Gap/Solid-State Circuit Breaker" and commonly assigned U.S. Pat. No. 10,276,321, entitled "Dynamic Coordination of Protection Devices in Electrical Distribution Systems," both which are also incorporated into this disclosure by reference. Further, although the exemplary embodiment of the electrical distribution panel 100 described and depicted herein is specially designed for 'intelligently controlled' or 'smart' SSCBs, those of skill in the relevant art will appreciate and understand that many of its various features and attributes can also be used, modified or adapted so that the panel can serve as a distribution panel for SSCBs that do not have 'smart' capabilities and/or that do not have any ability to be 'intelligently controlled.' The electrical distribution panel 100 could also be modified or adapted to serve as a distribution panel for circuit breakers that do not even employ solid-state devices. Therefore, unless specifically specified in the words of the appended patent application claims, the electrical distribution panel 100 should not be construed as being restricted for use with any particular type of circuit breaker, whether the circuit breaker does or does not employ solid-state devices, and/or whether or not the circuit breaker is smart and/or intelligently controlled.

According to one embodiment of the invention, the electrical distribution panel 100 comprises a 'stacked' busbar 108 mounted to a back of the distribution panel 100 (or to the back wall of a panel enclosure, i.e., panelbox, within which the distribution panel 100 is contained). The stacked busbar 108, which can be better seen in FIGS. 2-4, comprises three electrically conductive (e.g., copper) layers (or 'bars') stacked one over the other with electrically insulating layers in between, thus providing a three-phase system for routing incoming three phase power to the line-in terminals of the SSCBs 102. Stacking the various bars one over the other, instead of mounting two or more busbars to the back of the distribution panel 100 side by side (or to the back wall of the panelbox side by side), helps minimize the amount of space and volume the SSCBs 102 occupy in the distribution panel 100.

Figure 2:
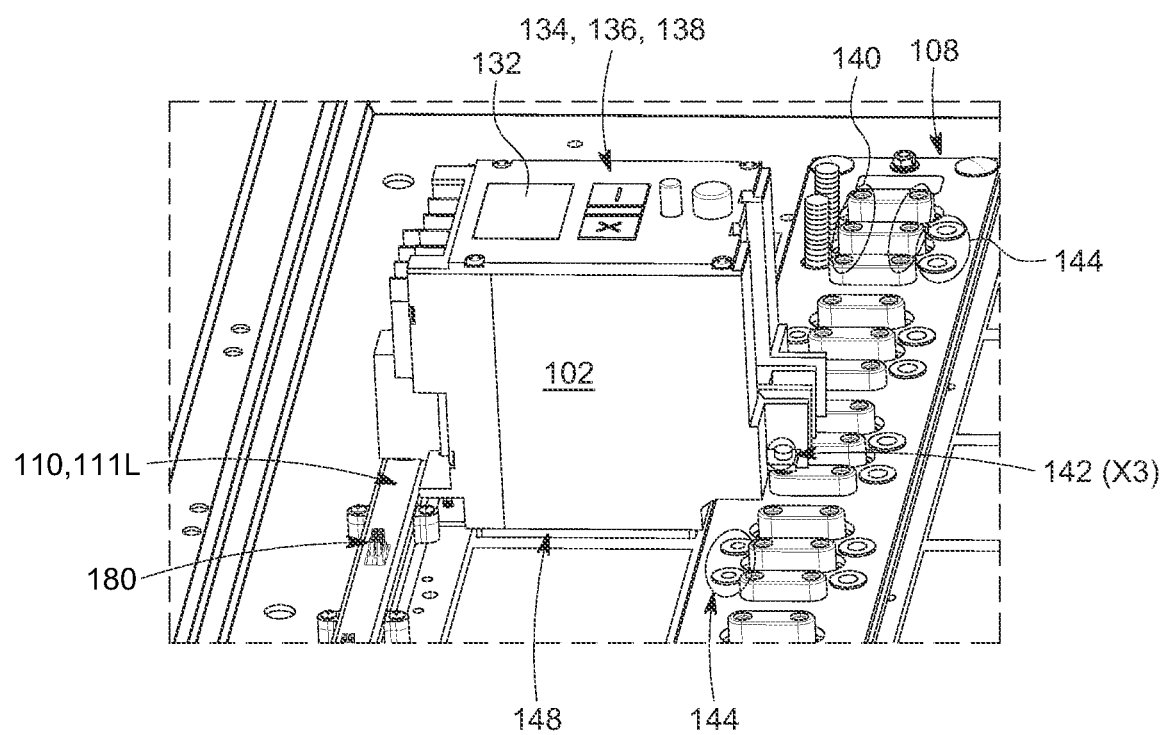
FIG. 2 is a perspective view drawing showing a portion of the electrical distribution panel depicted in FIG. 1, highlighting one solid-state circuit breaker's (SSCB's) ON/STANDBY/OFF buttons/indicators, electronic display, and line-side press-fit connection pins that press and fit into mating/matching quick-fit pin-mount type receptacles in the electrical distribution panel's multilayered (i.e., 'stacked') busbar.
Figure 3:
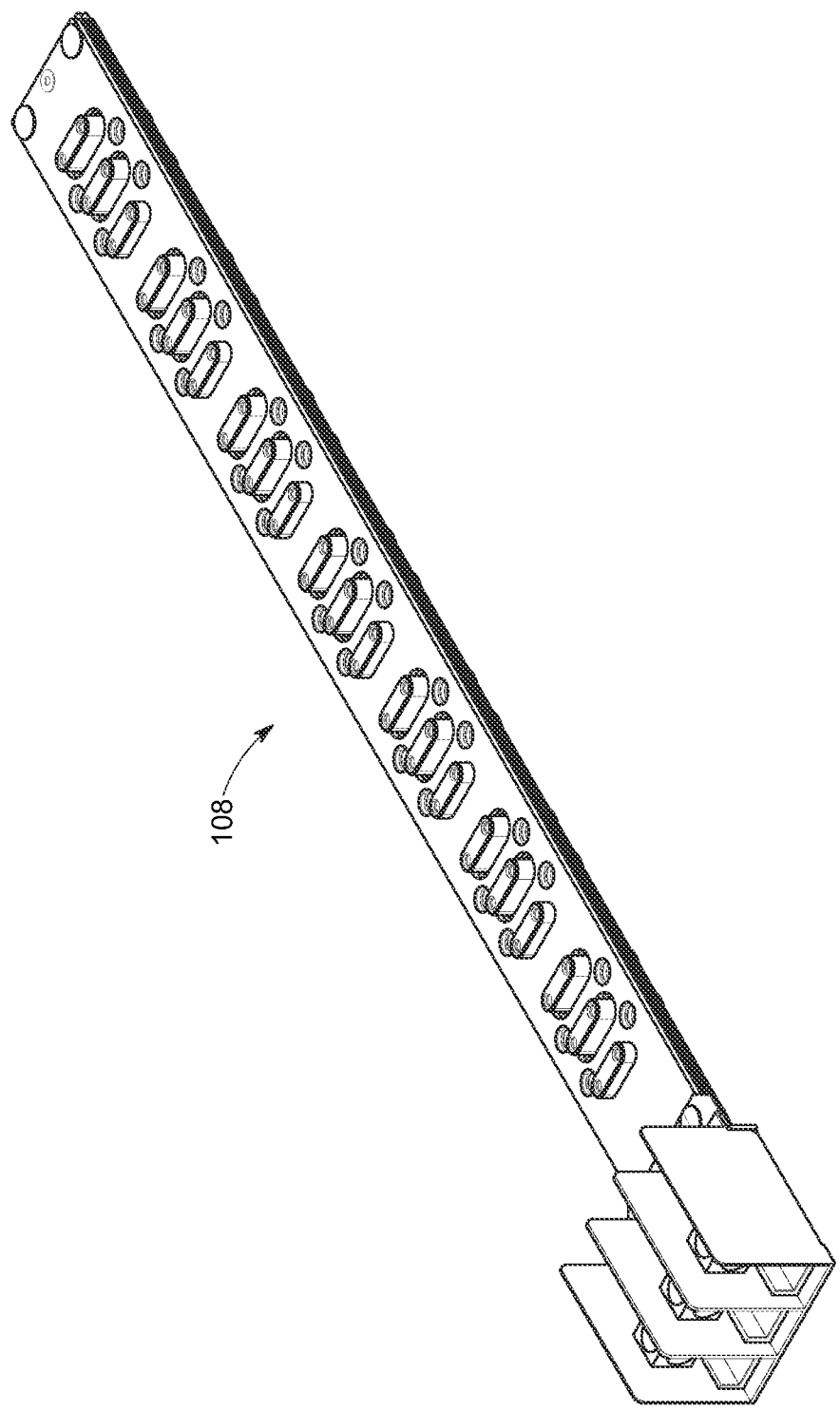
FIG. 3 is a perspective view drawing of the stacked busbar of the electrical distribution panel depicted in FIGS. 1 and 2.
Figure 4:
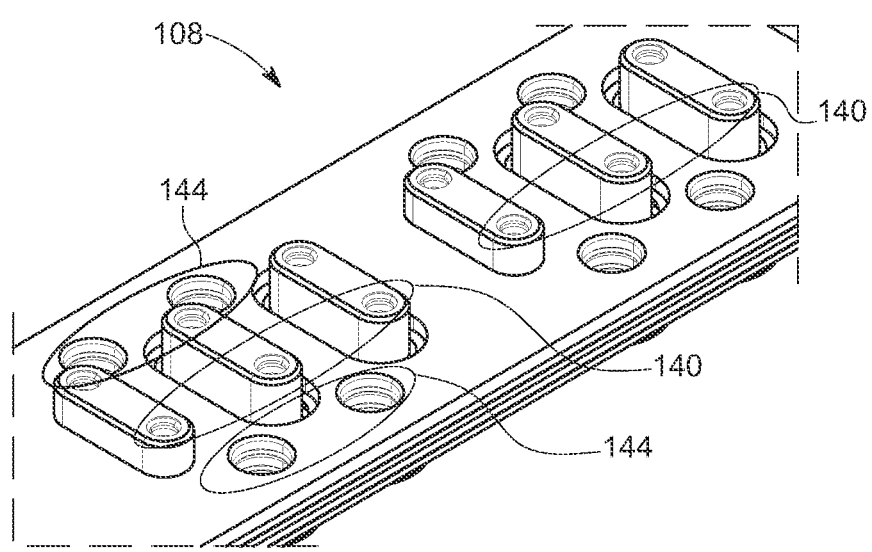
FIG. 4 is a perspective view drawing of the stacked busbar of the electrical distribution panel depicted in FIGS. 1-3, further revealing the three electrically conductive (e.g., copper) layers (or 'bars') stacked one over the other with electrically insulating layers in between, and the quick-fit pin-mount type receptacles into which the line-side press-fit connection pins of the SSCBs press and fit.
Figure 5A:
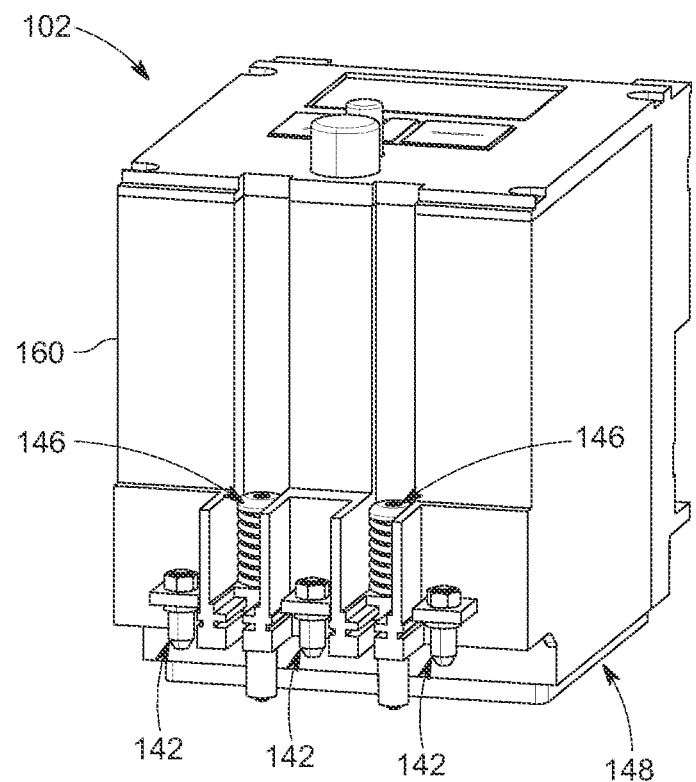
FIG. 5A is a line-side perspective view drawing of one of the electrical distribution system's SSCBs, highlighting the SSCB's press-fit connection pins that press and fit into the mating/matching quick-fit pin-mount type receptacles of the stacked busbar depicted in FIGS. 2-4, and the SSCB's heatspreader and hardware used to mount the heatspreader and SSCB to a panelboard heatsink at the back of the electrical distribution panel.
Figure 5B:
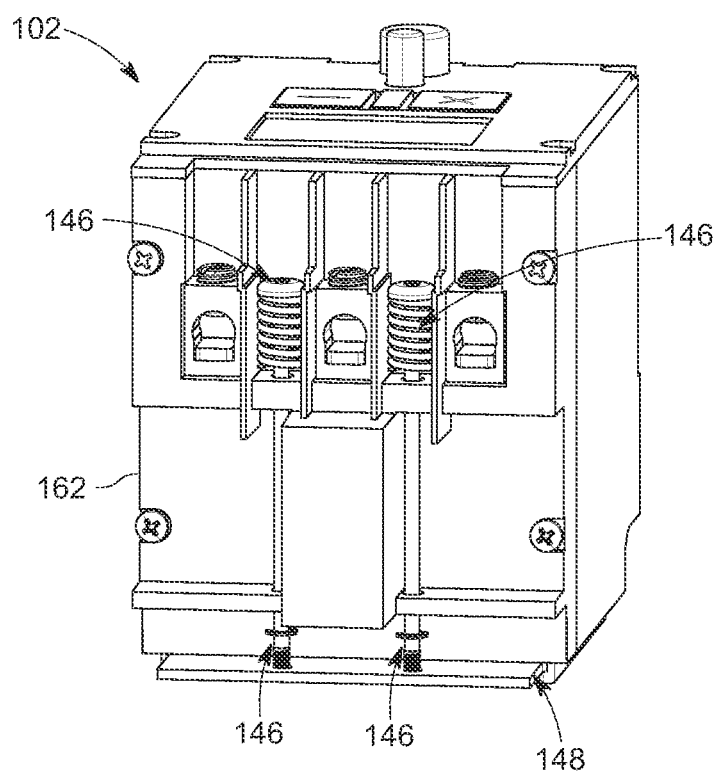
FIG. 5B is a load-side perspective view drawing of the SSCB depicted in FIG. 5A, highlighting the SSCB's load-side connection lugs, heatspreader, and hardware used to mount the heatspreader and SSCB to the panelboard heatsink.
Figure 6:
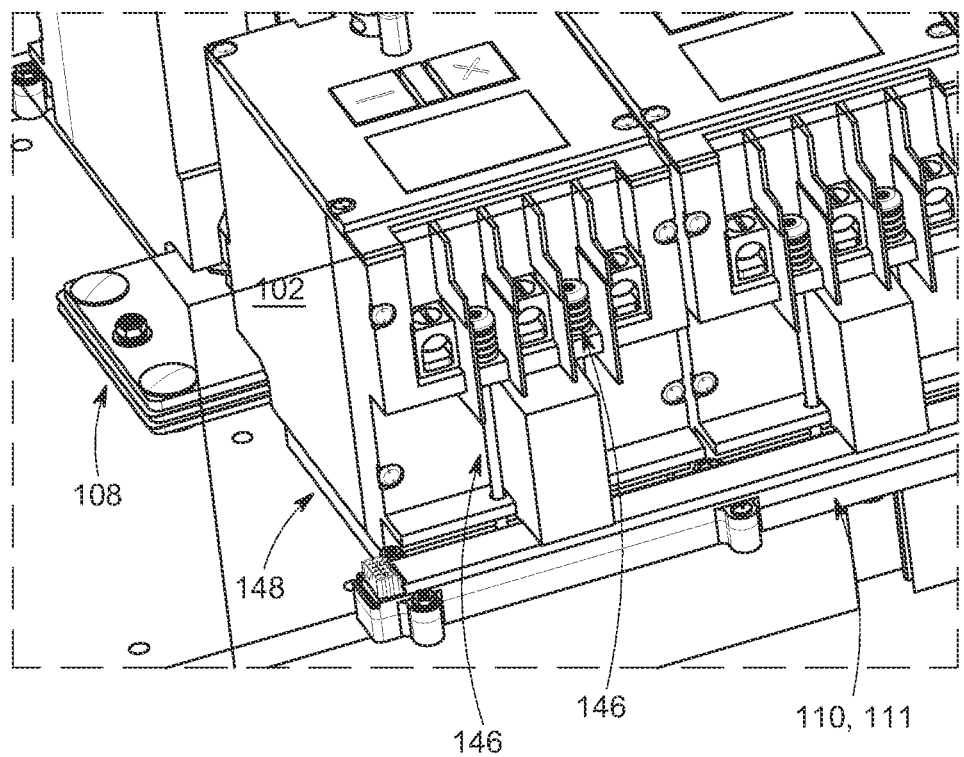
FIG. 6 is a perspective view drawing of a portion of the electrical distribution panel depicted in FIG. 1, further illustrating how, in one embodiment of the invention, the SSCBs connect to both the stacked busbar (line-side) and communications and control (comm/control) bus (load-side) of the electrical distribution panel, and how the heatspreaders of the SSCBs mount to the panelboard heatsink.
Figure 7:
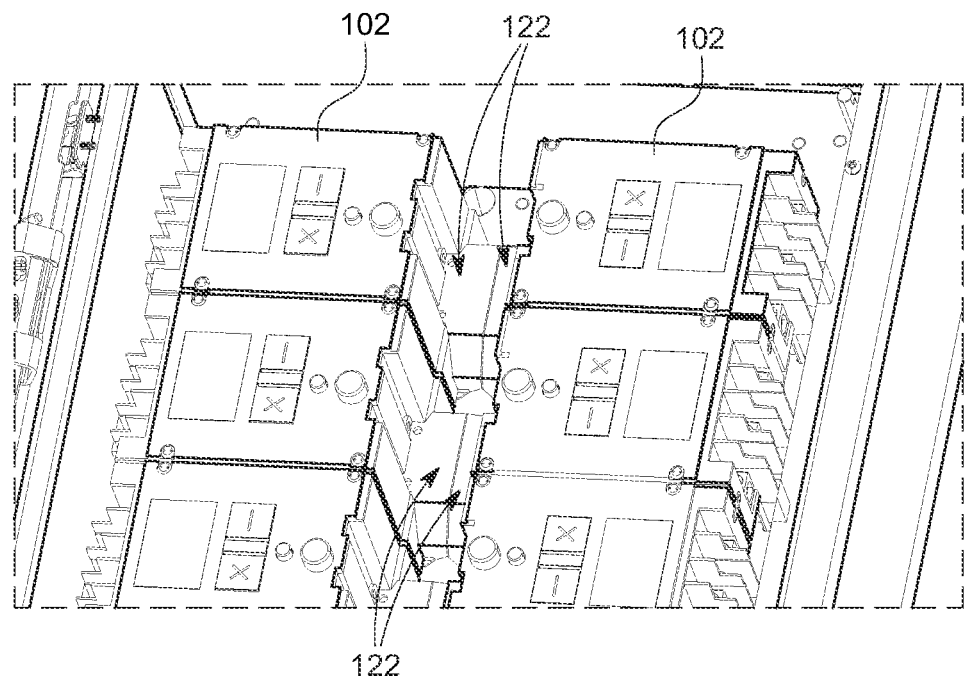
FIG. 7 is a perspective view drawing of a portion of the electrical distribution panel depicted in FIG. 1, further illustrating how, in one embodiment of the invention, the electrical distribution panel further includes hot-connection covers that cover the line-side connections to the stacked busbar and that serve to prevent anyone who may access the panel from touching the line-side connections when any one or more of the SSCBs is/are ON and the line-side connections are 'live' or 'hot''.

As can also be seen in FIGS. 2-4, the stacked busbar 108 further includes a plurality of electrically conductive receptacles 142, grouped in sets of three and formed along the busbar's length, which are electrically connected to the three conductive layers ('bars'). Each conductive receptacle 140 in each three-member group is electrically connected to one of the electrically conductive layers (bars), thus providing a three-phase line-side input for each SSCB 102. In the exemplary embodiment of the stacked busbar 108 depicted in FIGS. 2-4 the receptacles 140 in each three-member group are quick-fit pin-mount type receptacles 140 sized and configured to receive three mating/matching press-fit connection pins 142 on the line-side of each corresponding SSCB 102. The pin-mount type receptacles 140 and mating/matching press-fit connection pins 142 are preferred since this type of electrical connection makes mounting the SSCBs 102 in the distribution panel 100 very easy.

In one embodiment of the invention stacked busbar 108 further has a plurality of thru-holes 144 (or 'insulated disks') formed through or in it—two thru-holes 144 for each SSCB 102. The two thru-holes 144 allow two spring-loaded screws 146 to access matching/mating screw holes at the back of the electrical distribution panel 100. In one embodiment of the invention, the two spring-loaded screws 146 are held by a line-side SSCB enclosure piece 160 (see FIG. 5A) and, when being mounted into the distribution panel 100, are screwed into two matching/mating screw holes tapped into a large heatsink 150 attached to the back of the distribution panel 100 or back of the panelbox within which the distribution panel 100 is being housed (see FIG. 9). Two more spring-loaded screws 146 held by a load-side SSCB enclosure piece 162 (see FIGS. 5B and 6) screw into two matching/mating screw holes in the distribution panel heatsink 150.

Figure 8:
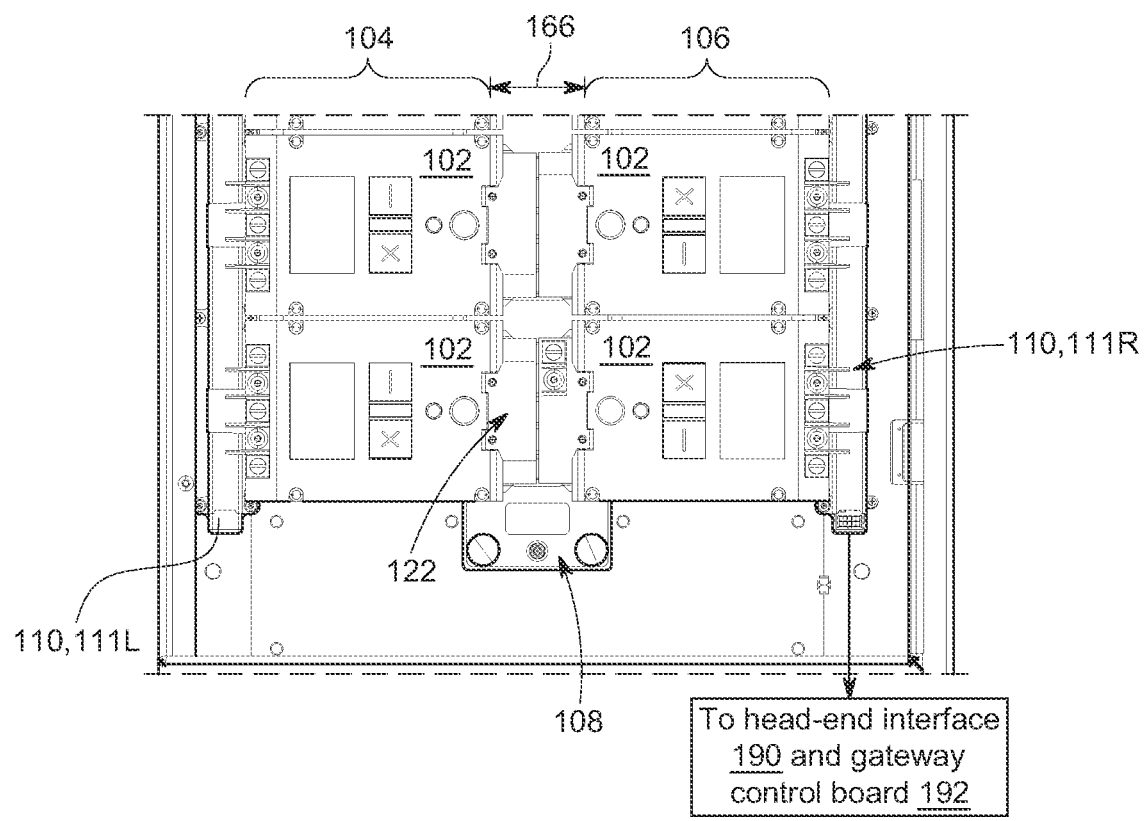
FIG. 8 is a plan view drawing of a portion of the electrical distribution panel depicted in FIGS. 1 and 7, further illustrating the hot-connection covers that cover the line-side connections to the busbar, and left and right comm/control bus rails/covers, which cover left and right sections of the comm/control bus and which are mounted near the left and right sidewalls of the panelbox, according to one embodiment of the invention.
Figure 9:
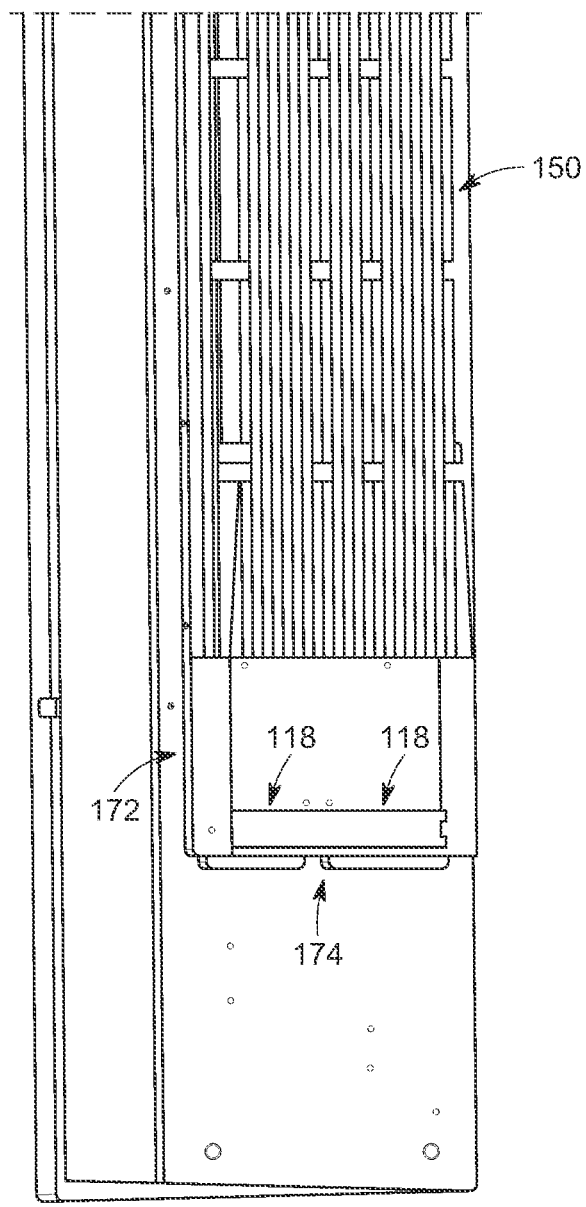
FIGS. 9 and 10 are perspective view drawings of a back side of the electrical distribution panel depicted in FIG. 1, highlighting the distribution panel heatsink, cooling fans, and duct and intake vent through which air generated by the cooling fans is directed to blow on the distribution panel heatsink, in accordance with one embodiment of the invention.

As can be best seen in FIG. 8, which is a plan view of a portion of the front of distribution panel 100, using the 'stacked' busbar 108 and forming thru-holes 144 through it for the line-side spring-loaded mounting screws 146 minimizes the space (or 'gap') 166 between the left and right columns 104 and 106 of SSCBs 102. This space-saving feature of the electrical distribution panel 100 is important since the side-to-side wall spacing inside distribution panel enclosures (i.e., panelboxes) is often very limited, and even more important considering that the wall-to-wall dimensions and working space that must be reserved on the load sides of circuit breakers (e.g., to connect cables to the load-side terminals of circuit breakers in the panelbox) are set by industry standards.

In accordance with one embodiment of the invention, a portion (or portions) of the back of distribution panel 100 and/or portion (or portions) of the back wall of a panelbox within which the distribution panel 100 is contained is/are removed (e.g., cut out) so that the large distribution panel heatsink 150 is exposed at the back of the distribution panel 100. In this manner, when each SSCB 102 is mounted in the distribution panel 100 using its four spring-loaded screws 146, its thermally conductive heatspreader 148 (see FIGS. 5A, 5B and 6) is in direct physical contact with the large distribution panel heatsink 150. This direct and physical contact configuration optimizes heat transfer away from the SSCBs 102 power semiconductors and into the environment. In other words, the direct physical contact allows heat generated by the SSCB's power semiconductors to be more readily transferred (convected) away from the SSCBs' heatspreaders 148 to the distribution panel heatsink 150, which can then, using its radiating fins, radiate the collected heat into the environment. Note that the four spring-loaded screws 146 used to mount each SSCB 102 in the distribution panel 100 ensure that the SSCB's 102's heatspreader 148 is pressed firm and flat against the distribution panel heatsink 150. In one embodiment of the invention, when any given SSCB 102 is being installed/mounted in the distribution panel 110, a thermal compound (e.g., a thermal grease) is applied to the SSCB's heatspreader 148 and/or the distribution panel heatsink 150, to enhance thermal conduction across the heatspreader 148/distribution panel heatsink 150 interface. In other embodiment, a thermal pad is inserted between the SSCB's heatspreader 148 and the distribution panel heatsink 150. It should be mentioned that, in addition to the springs in the spring-loaded screws 146 ensuring that the SSCB heatspreaders 148 are pressed firm and flat against the distribution panel heatsink 150, they also prevent an installer (e.g., electrician) from overtightening the screws. This is important since without any ability to prevent overtightening, an SSCB's housing could be damaged during installation and/or the SSCBs' mounting screws and/or screw holes in the distribution panel heatsink 150 would be more susceptible to being stripped during installation. In one embodiment of the invention this problem is ameliorated by a distribution panel heatsink 150 that has a 'blind hole' feature, so that even if one or more of the springs in the spring-loaded screws 146 for any given SSCB 102 is missing, the screws would bottom out in the blind holes when being screwed in and thereby prevent overtightening and possible damage to the SSCB's housing or to the SSCB itself.

Figure 14:
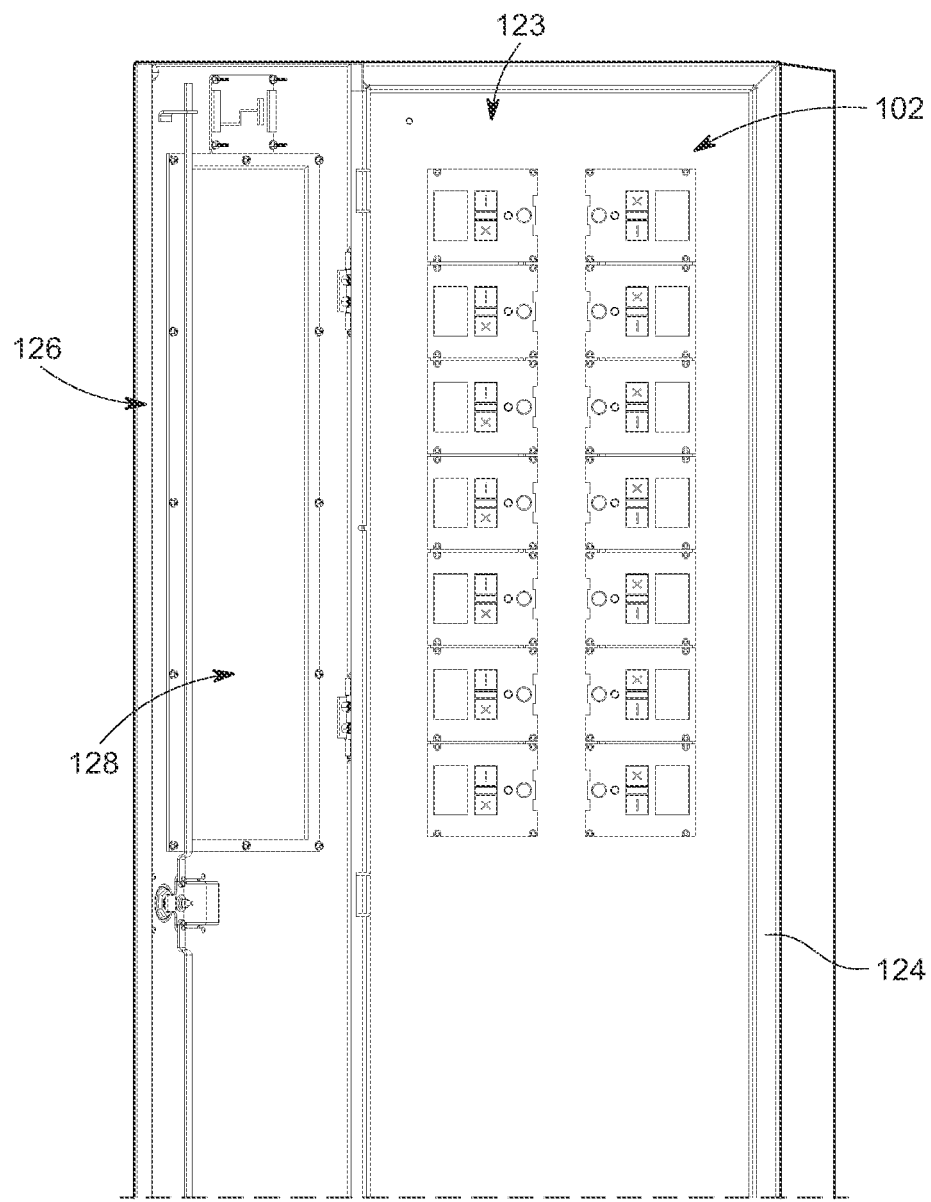
FIG. 14 is a perspective view drawing of the electrical distribution panel depicted in FIG. 1, further illustrating how, in one embodiment of the invention, live wires fed into the panel from the grid and to the stacked busbar are covered by a dead front or panel filler.

In accordance with one embodiment of the invention, the distribution panel 100 further comprises hot-connection covers 122 that cover the SSCB line-in (i.e., line-side) connections at the stacked busbar 108. These hot-connection covers 122, which can be more clearly seen in FIGS. 7 and 8, prevent anyone who may access the panel 100 (e.g., a homeowner) from touching the line-side connections when the SSCB 102 is ON and the line-side connections are 'live' or 'hot.' All remaining hot connections in the distribution panel 100 and wires that are not covered by the hot-connection covers 122 (e.g., live wires that are fed into the panel from the grid and to stacked busbar 108) are covered by dead front or panel filler 123, as illustrated in FIG. 14.

Figure 10:
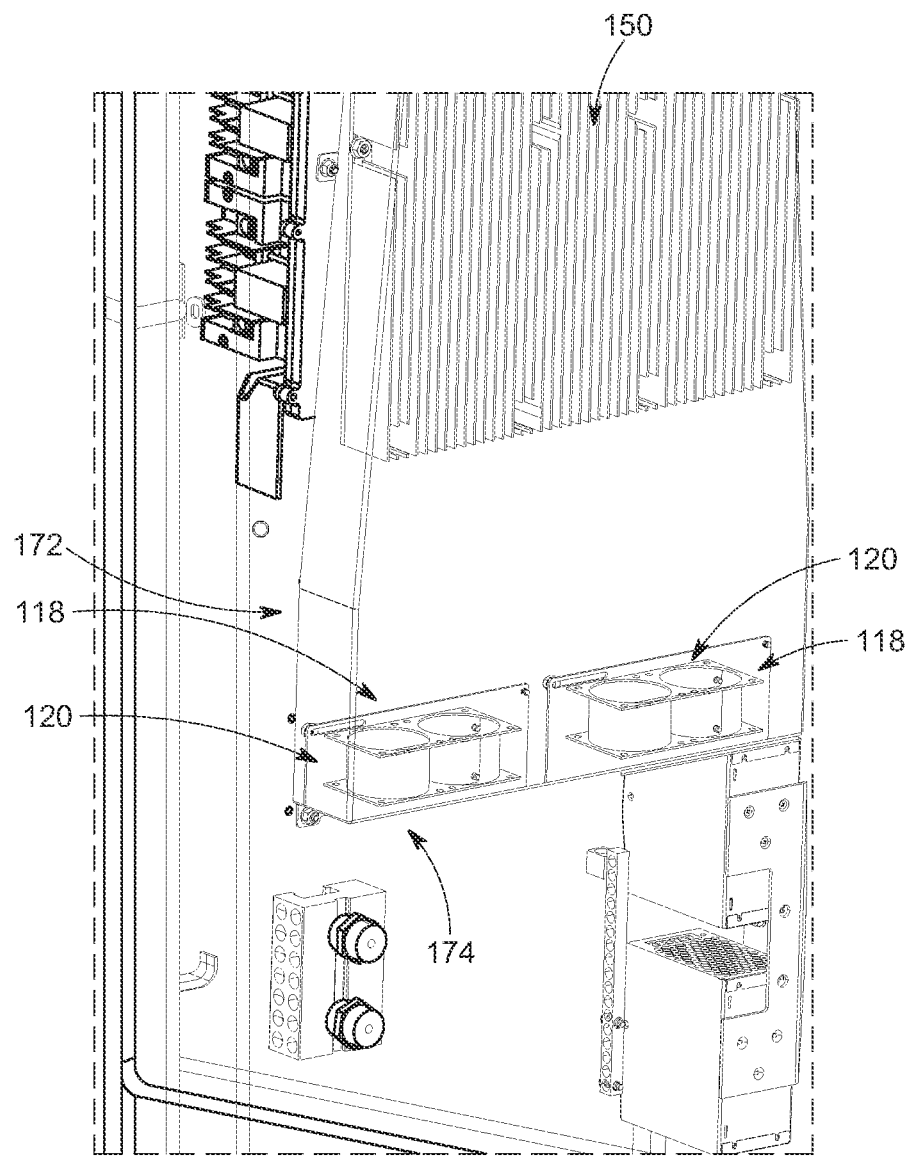
Figure 11:
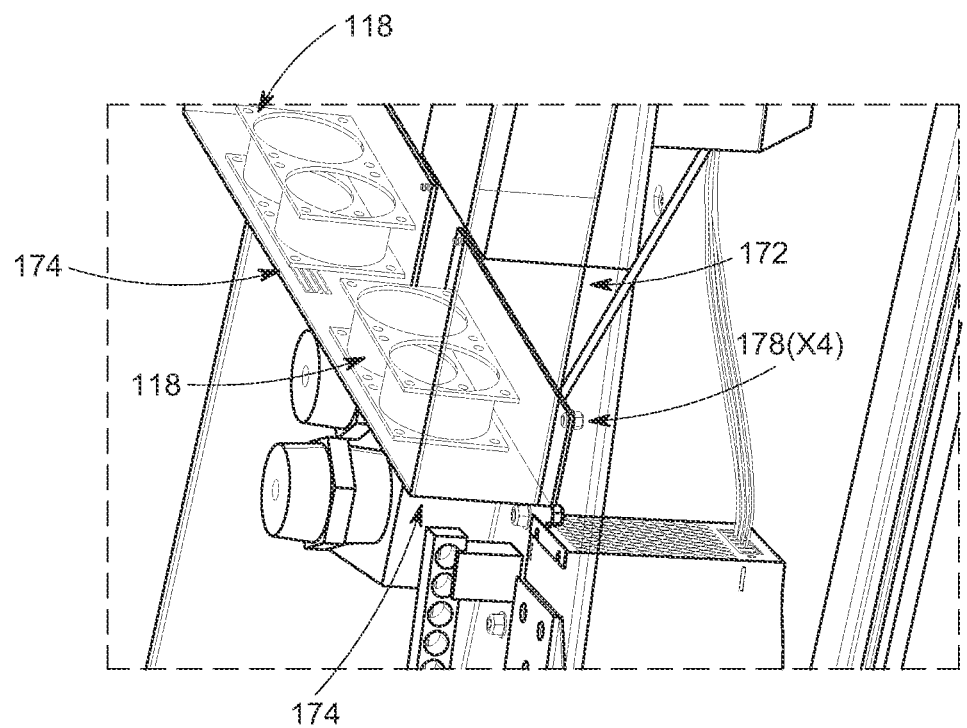
FIG. 11 is a perspective view drawing of a portion of the electrical distribution panel depicted in FIG. 1, revealing and highlighting access screws, which under normal operating conditions hold the front-access fan covers in place, but which when unscrewed allow the front-access fan covers to slide open so that the cooling fans behind the covers can be easily accessed from the front of the electrical distribution panel.
Figure 12:
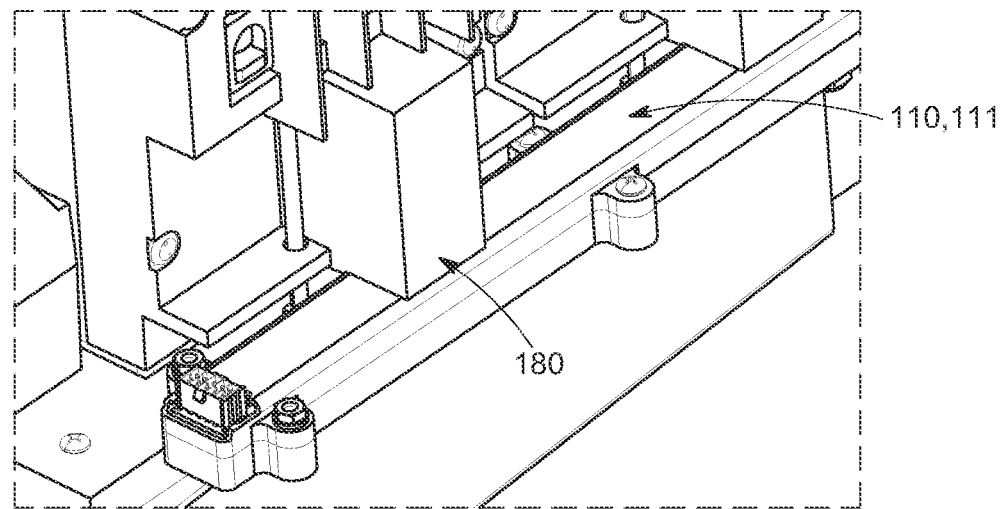
FIG. 12 is a perspective view drawing of a portion of the electrical distribution panel depicted in FIGS. 1 and 8, further revealing and highlighting how in one embodiment of the invention the left and right comm/control bus rails/covers have a series of holes through which a series of comm/control bus connectors protrude and connect to mating/matching comm/control bus connectors on the SSCBs.
Figure 13:
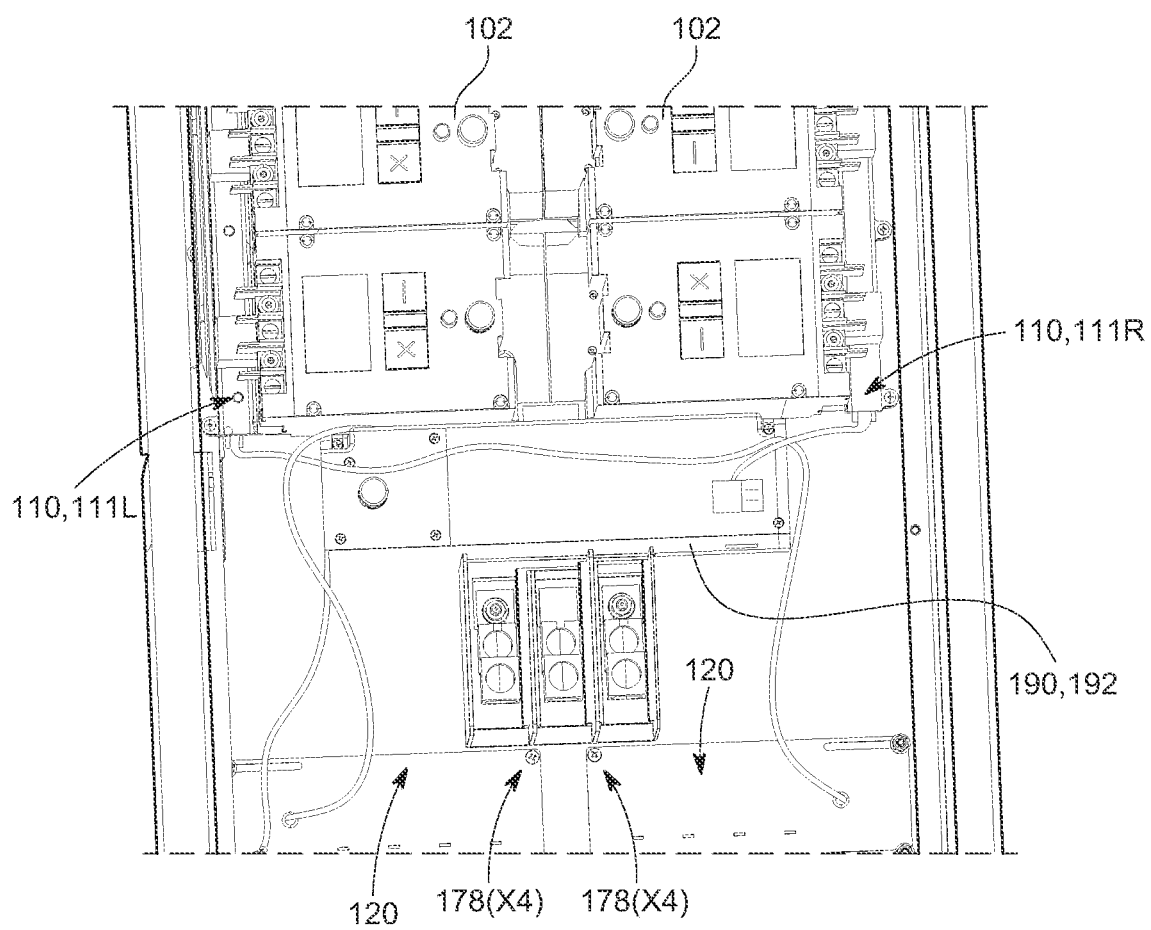
FIG. 13 is a plan view drawing of a portion of the electrical distribution panel depicted in FIG. 1, further revealing and highlighting the head-end interface, gateway control board, along with their electrical connections to the comm/control bus, and the electrical connectivity between the redundant DC power supplies of the electrical distribution panel to the cooling fans located behind the front-access fan covers, in accordance with one embodiment of the present invention.

FIG. 10 is a drawing of a back portion of the distribution panel 100 when the distribution panel 100 is contained in panelbox 124, highlighting a portion of the distribution panel heatsink 150 that is attached to the back wall of the panelbox 124 and the distribution panel heatsink's 150's radiating fins. FIG. 10 also reveals that the distribution panel 100 further includes cooling fans 118, which are configured so that they blow cool air received from intake vent 174 up, through duct (or 'shroud') 172 and onto the radiating fins of the distribution panel heatsink 150. In one embodiment of the invention, best illustrated in FIGS. 1 and 10-12, the cooling fans 118 are accessible from the front of the distribution panel 100, specifically, through front-access fan covers 120. The front-access fan covers 120 slide left or right (depending on which cover 120—the one on the left side, which slides left or the one on the right side, which slides right) after removing four access screws 178 (see FIG. 11). The cooling fans 118 can then be cleaned and removed and replaced if necessary (e.g., if one fails), without having to remove the distribution panel 100 and without having to remove the panelbox 124 from the wall of the building onto which it is mounted.

In a preferred embodiment of the invention the electrical distribution panel 100 is a 'smart' distribution panel 100 specifically designed to control the delivery and distribution of electrical power using a plurality of 'smart' or 'intelligently controlled" SSCBs, such as described in aforementioned copending and commonly assigned assigned U.S. patent application Ser. No. 16/898,538, or commonly assigned U.S. Pat. No. 10,541,530, entitled "Hybrid Air-Gap/Solid-State Circuit Breaker," and commonly assigned U.S. Pat. No. 10,276,321, entitled "Dynamic Coordination of Protection Devices in Electrical Distribution Systems." To accommodate these and other types of smart and intelligently controlled SSCBs, in one embodiment of the invention, the smart distribution panel 100 further comprises a comm/control bus 110. As can be best seen in FIGS. 2, 7 and 8, the comm/control bus 110 is covered by a comm/control bus rail 111 that is attached to the back of the distribution panel 100 or back wall of the panelbox 124 within which the distribution panel 100 is contained. The comm/control bus 110 and rail/cover 111 are actually split into two sections (see FIG. 8). The first and second sections 111L and 111R are mounted near the left and right sidewalls of the panelbox 124, respectively, and in the workspace where electrical cabling connects to the load-side connections terminals of the SSCBs 102. Further, each comm/control bus/rail section 111L and 111R includes a series of comm/control bus connectors 180 (see FIGS. 2 and 12) that corresponding SSCB comm/control bus connectors connect to when the SSCBs 102 are mounted/installed in the distribution panel 100. In one embodiment of the invention, each comm/control bus connector 180 has a unique address that allows the exact physical location of each SSCB 102 to be known or ascertained. In one embodiment of the invention, the address is hardwired into the comm/control bus 110. In another, the addresses are electronically assigned, for example, by a local or remotely located computer connected to or in communication with head-end interface 190. The unique addresses also allow any given SSCB's 102's exact physical location in the distribution panel 100 to be known or ascertained, and to know or ascertain whether an SSCB 102 is connected to the left comm/control bus/rail section 111L or to the right comm/control bus/rail section 111R. The ability to know or ascertain which section (111L or 111R) any given SSCB 102 is connected to is important since those SSCBs 102 that are mounted in the left column 104 of the distribution panel 100 are rotated 180 degrees compared to those mounted in the right column 106 and, consequently, the electronic displays 132 of the SSCBs 102 in the left column 104 are also rotated 180 degrees with respect to the electronic displays 132 of the SSCBs 102 in the right column 106. The ability to know or ascertain which comm/control bus/rail section (left 111L or right 111R) each SSCB 102 is connected to, thus allows all SSCBs 102s in the distribution panel 100 to be controlled so that the information they display on their electronic displays 132 is always in the 'right-side-up' position (i.e., so that information on the displays 132 of SSCBs 102 in one column is not presented upside down).

In one embodiment of the invention comm/control bus 110 comprises a controller area network (CAN) bus. In another it comprise an inter-IC (I2C). However, other comm/control bus technologies may be alternatively used, as will be appreciated and understood by those of ordinary skill in the art. As can be best seen in FIG. 13, the comm/control bus 110 is electrically connected to a head-end interface 190 that contains a gateway control board 192. The gateway control board 192 is powered by one of redundant 24 VDC power supplies 200 (shown in FIG. 1). (One of the redundant DC power supplies 200 serves as a backup, in case the other fails.) In addition to supplying DC power to gateway control board 192, redundant 24 VDC power supplies are also configured to supply DC power to cooling fans 118 and to the various printed circuit boards (PCBs) in the SSCBs 102 (via comm/control bus 110), for example, to driver boards in the SSCBs 102 that control whether the SSCBs' power semiconductor devices are switched ON or OFF.

The comm/control bus 110 and gateway control board 192 further allow a local or remotely located computer to connect to the head-end interface 190 and communicate and/or control the smart or intelligently controlled SSCBs 102, for example, via a wired local area network (LAN), a wide area network (WAN), Internet, etc., and/or wirelessly via a wireless transceiver in the head-end interface 190. The local or remotely located computer is then able, to among other things: program and direct the control and operation of the smart or intelligently controlled SSCBs 102; determine the trip and operational status of each SSCB 102 in the distribution panel 100 (e.g., ON, OFF, or STANDBY); command any given SSCB 102 to switch its power semiconductor(s) ON and OFF; command any SSCB 102 to switch its power semiconductor device(s) OFF and, if the SSCB has the capability, form an air gap between its line-in (i.e., line-side) and line-out (i.e., load-side) terminals; test, monitor, and/or log both real time and non-real-time operating characteristics of the SSCBs 102 (e.g., real time line currents, line-in and line-out voltages, FET power module 118 operating temperature, etc.); selectively and dynamically coordinate the SSCBs 102 in the distribution panel, even in real time; diagnose performance related problems any given SSCB 102 in the distribution panel 100 may experience or encounter; set, manipulate, and allow a person (e.g., an electrician or engineer) to manually set and alter any given SSCB's 102's trip settings (e.g., time-to-trip for both short circuits and overloads); and allow a person to define, change and control what information is being displayed on any given SSCB's 102's electronic display. Note that the local or remote computer may be any type of computer, including a large mainframe computer, desktop computer, laptop computer, hand-held computer, tablet computer, smartphone, etc.

Figure 15:
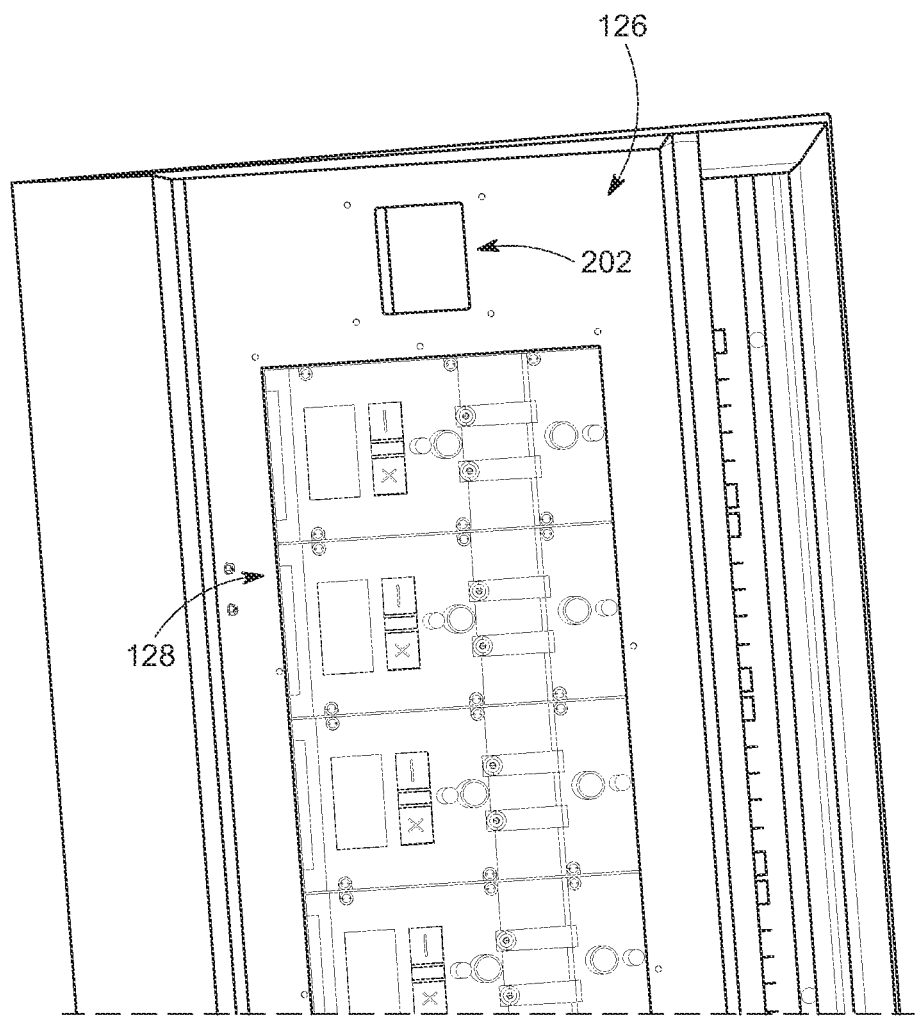
FIG. 15 is a perspective view drawing of a portion of the electrical distribution panel depicted in FIG. 1, further illustrating how, in one embodiment of the invention, the electrical distribution panel includes a panelboard electronic display mounted in a panelbox door, and the panelbox door includes a panelbox window, through which the SSCBs and their respective electronic displays can be viewed.
Figure 16:
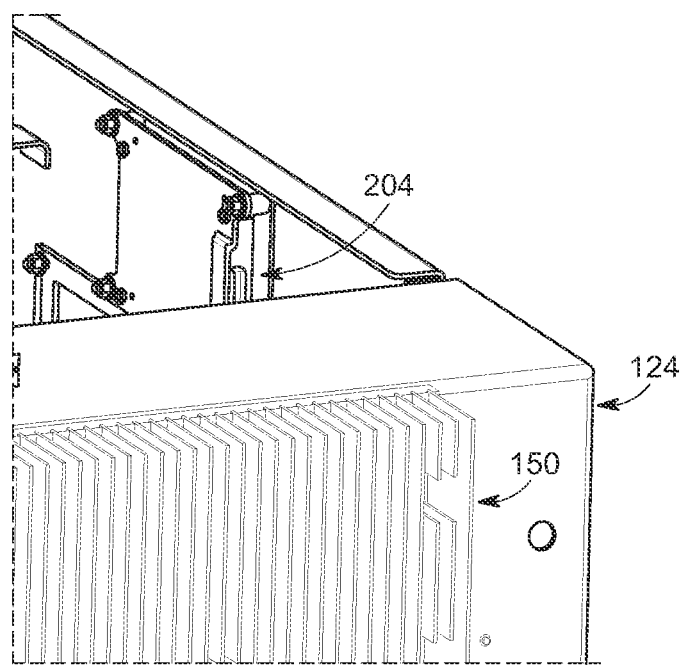
FIG. 16 is a perspective view drawing of a back portion of the electrical distribution panel and panelbox depicted in FIGS. 1 and 15, illustrating how in one embodiment of the invention a connector is provided which allows a wiring harness (not shown) to connect the panelboard electronic display to the comm/control bus in the electrical distribution panel, and thereby allow a local or remote computer connected to the head-end interface to control and update, via the comm/control bus, what information is being displayed by the panelboard electronic display.

As was explained above in reference to FIG. 1, the distribution panel 100 is preferably, though not necessarily, housed in a panelbox 124 with a panelbox door 126 and panelbox door window 128 through which the distribution panel 100 and its various SSCBs 102 can be viewed. (See FIG. 1 and accompanying description.) In one embodiment of the invention, illustrated in FIG. 15, the panelbox door 126 is further equipped with a panelboard electronic display 202. The panelboard electronic display 202 is mounted in the panelbox door 126 and configured so that the information it displays is visible to a person (e.g., homeowner or electrician) from outside the panelbox 124 when the panelbox door 126 is closed, as depicted in FIG. 15. Among other information, the panelboard electronic display 202 is configured to display and identify the electrical power source the distribution panel 100 is being 'fed from,' the total amperage rating of the distribution panel 100, and other non-real-time and/or real-time information, for example real-time current and/or voltage information, panel temperature, etc. Preferably, like the SSCB displays 132, the panelboard electronic display 202 comprises an electronic ink display, so that information it displays continues to be displayed even if DC power to the panelboard electronic display 202 is removed. As can be seen in FIG. 16, a connector 204 is provided which allows a wiring harness (not shown) to connect the panelboard electronic display 202 to the comm/control bus 110. By connecting the panelboard electronic display 202 to the comm/control bus, a local or remote computer connected to or in communication with the comm/control bus 110 can then control and update what information is being displayed.

While various embodiments of the present invention have been described, they have been presented by way of example and not limitation. It will be apparent to persons skilled in the relevant art that various changes in form and detail may be made to the exemplary embodiments without departing from the true spirit and scope of the invention. Accordingly, the scope of the invention should not be limited by the specifics of the exemplary embodiments but, instead, should be determined by the appended claims, including the full scope of equivalents to which such claims are entitled.

The invention claimed is:

1. An electrical distribution panel, comprising:
   a busbar; and
   a plurality of solid-state circuit breakers (SSCBs), each SSCB including:
      one or more line-side terminals that electrically connect to the busbar and one or more load-side terminals for connecting to a load;
      a solid-state device configured between the SSCB's line-side and load-side terminals;
      a closeable air gap connected in series with the SSCB's solid-state device, between the SSCB's line-side and load-side terminals, the closeable air gap configured to provide galvanic isolation between the line-side and load-side terminals, when open; and
      an air gap assembly that controls whether the air gap is open or closed, and that is automatically triggered to open the air gap upon a short circuit or overload of unacceptably long duration occurring in a load circuit attached to the SSCB's load-side terminals,
   wherein each of the SSCBs operates, at any given time, in one of three possible operating states: an OFF state during which the SSCB's solid-state device is switched OFF and its air gap is open, an ON state during which the SSCB's solid-state device is switched ON and its air gap is closed, and a STANDBY during which the SSCB's solid-state device is switched OFF and its air gap is closed.

2. The electrical distribution panel of claim 1, wherein each SSCB is enclosed in a housing having a front with indicators and/or button that indicate and inform whether, at any given time, said each SSCB is in the OFF state, the ON state, or the STANDBY state.

3. The electrical distribution panel of claim 1, wherein each of the SSCBs of the plurality of SSCBs includes a thermally conductive heatspreader configured to conduct heat away from its solid-state device, and the electrical distribution panel further comprises a distribution panel heatsink that is in thermal contact with the thermally conductive heatspreaders.

4. The electrical distribution panel of claim 1, further comprising:
   a communications and control (comm/control) bus in electrical communication with the plurality of SSCBs; and
   a head-end interface communicatively coupled to the comm/control bus through which an external computer can set and alter trip settings of the plurality of SSCBs.

5. The electrical distribution panel of claim 1, wherein each of the SSCBs of the plurality of SSCBs is enclosed in a housing having a front with an electronic display.

6. The electrical distribution panel of claim 5, further comprising:
- a communications and control (comm/control) bus in electrical communication with the plurality of SSCBs; and
- a head-end interface communicatively coupled to the comm/control bus through which an external computer can set and control what information is displayed by the electronic displays of the plurality of SSCBs.

7. The electrical distribution panel of claim 6, wherein the comm/control bus is split into two or more comm/control bus/rail sections that include a plurality of comm/control bus connectors which the plurality of SSCBs connect to, and that have, or are assigned, unique addresses that identify or indicate physical locations of the plurality of SSCBs in the distribution panel.

8. The electrical distribution panel of claim 1, further comprising a panelboard electronic display.

9. The electrical distribution panel of claim 8, further comprising:
- a communications and control (comm/control) bus in electrical communication with the plurality of SSCBs; and
- a head-end interface communicatively coupled to the comm/control bus through which an external computer can set and control what information is displayed by the panelboard electronic display.

10. The electrical distribution panel of claim 8, further comprising a panelbox with a panelbox door that holds the panelboard display.

11. The electrical distribution panel of claim 10, wherein each of the SSCBs of the plurality of SSCBs includes an electronic display, and the panelbox door includes a panelbox door window through which the electronic displays can be viewed, when the panelbox door is closed.

12. The electrical distribution panel of claim 1, wherein the busbar comprises a stacked bus bar having two or more alternating and stacked conductive and insulating layers.

13. The electrical distribution panel of claim 12, further comprising a plurality of hot-connection covers that cover the line-side terminal connections to the stacked busbar and that prevent a person who may access the electrical distribution panel from coming in contact with the line-side terminal connections.

14. The electrical distribution panel of claim 12, wherein the stacked busbar includes a plurality of electrically conductive receptacles formed along the busbar's length, and the plurality of SSCBs include electrically conductive line-side press-fit connection pins that fit into the plurality of electrically conductive receptacles.

15. The electrical distribution panel of claim 3, further comprising one or more cooling fans configured to blow air on the distribution panel heatsink.

16. The electrical distribution panel of claim 15, further comprising one or more front-access fan covers that provide access to the one or more cooling fans from a front of the electrical distribution panel.

\* \* \* \* \*